United States Patent [19]

Kaleida

[11] Patent Number: 4,493,952
[45] Date of Patent: Jan. 15, 1985

[54] MEMBRANE SWITCH HAVING INTEGRAL SWITCH TAIL INSULATOR

[75] Inventor: Richard H. Kaleida, Salem, Mass.

[73] Assignee: AMP Incorporated, Harrisburg, Pa.

[21] Appl. No.: 527,042

[22] Filed: Aug. 29, 1983

[51] Int. Cl.³ .................. H01H 13/70; H05K 1/00
[52] U.S. Cl. .................. 200/5 A; 200/159 B; 361/398
[58] Field of Search .................. 200/5 A, 159 B; 361/398, 400, 403, 404, 408, 416, 421

[56] References Cited

U.S. PATENT DOCUMENTS

| | | | |
|---|---|---|---|
| 4,145,584 | 3/1979 | Otterlei | 361/398 X |
| 4,158,115 | 6/1979 | Parkinson et al. | 200/5 A |
| 4,217,473 | 8/1980 | Parkinson | 200/5 A X |
| 4,356,358 | 10/1982 | Fukukura | 200/5 A |
| 4,425,484 | 1/1984 | Fukukura | 200/5 A |

Primary Examiner—J. R. Scott
Attorney, Agent, or Firm—F. W. Raring

[57] ABSTRACT

Membrane switch assembly comprises a substrate, a flexible membrane, and a separator between the substrate and the membrane. The substrate has circuit conductors thereon and has an integral tail onto which the conductors extend. The separator is a flexible film and has an integral tail insulator which extends over the surface of the tail in insulating relationship to the conductors on the tail. The tail insulator has an opening adjacent to its end through which the tail extends so that the end portions of the conductors are exposed and can be connected to external circuitry. In alternative embodiments, the tail insulator may extend from the membrane or from an additional layer or covering panel which is positioned in covering relationship to the membrane. Also, the tail may extend from the membrane in which case the tail insulator can extend from either the separator or the substrate.

12 Claims, 6 Drawing Figures

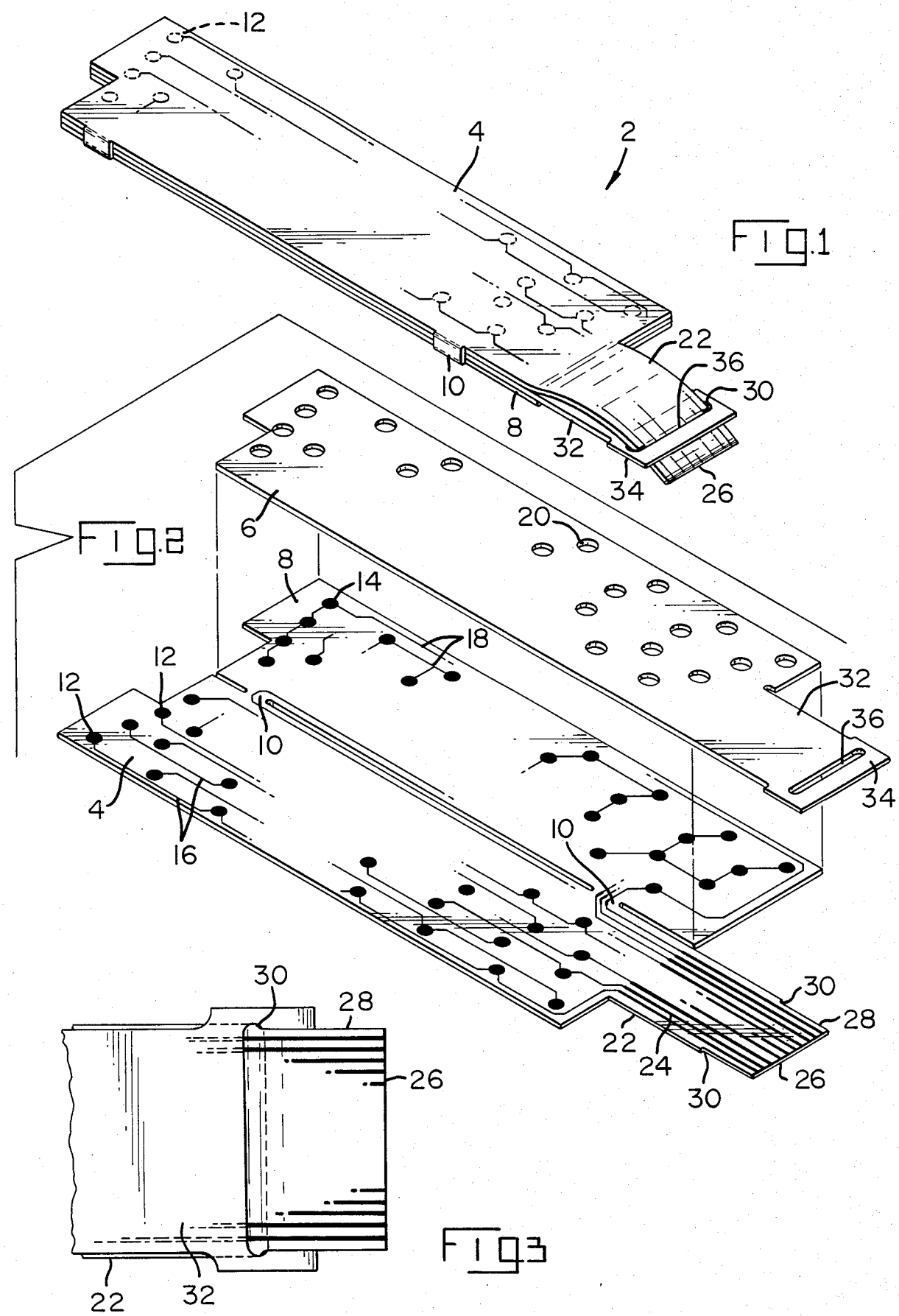

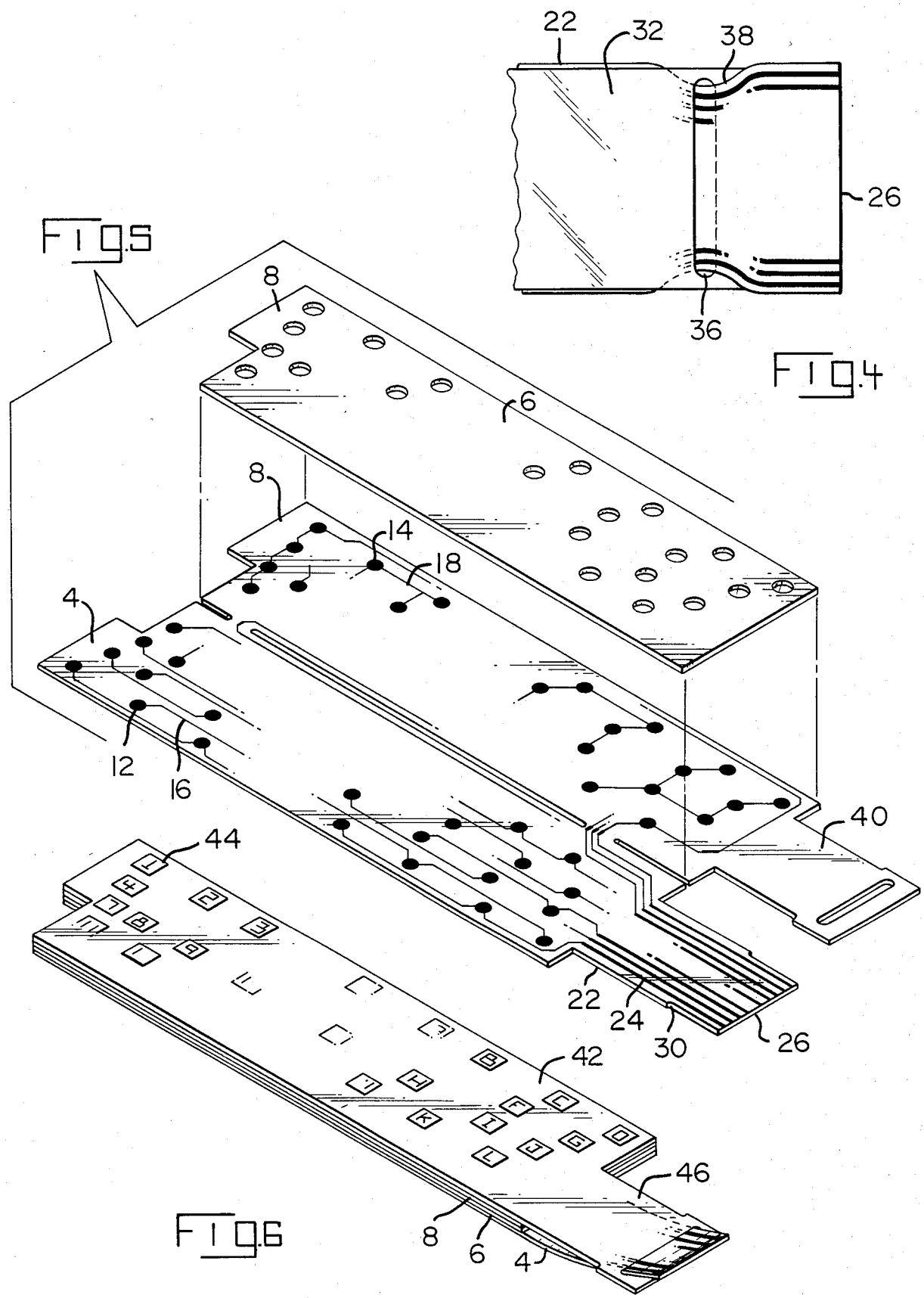

MEMBRANE SWITCH HAVING INTEGRAL SWITCH TAIL INSULATOR

FIELD OF THE INVENTION

This invention relates to membrane switch assemblies of the type comprising at least a substrate, a flexible membrane, and a separator wherein either the membrane or the substrate has an integral tail onto which circuit conductors extend. The invention is particularly directed to an improved membrane switch assembly which can be manufactured at reduced cost.

BACKGROUND OF THE INVENTION

A widely used type of membrane switch assembly comprises a substrate, a membrane which extends parallel to the substrate, and a separator which is between the opposed surfaces of the membrane and the substrate. Circuit conductors and switch sites are provided on the opposed surfaces and frequently, either the membrane or the substrate will be provided with an integral tail onto which the circuit conductors extend. The switch can then be connected to external circuits by means of a connector which would be coupled to the end portions of the conductors on the tail.

It is necessary, in the manufacture of membrane switches as described above, to provide insulating material on the circuit conductors on the tail in a manner such that these conductors will be insulated excepting for portions thereof which function as contact portions and which are engaged with conductors in a connector or the like. The insulation provided on the tail may take the form of a separate insulating layer which is bonded to the tail or other forms. In any event, the provision of the insulating layer to the tail always adds an additional step to the manufacturing process and greatly increases the cost of producing the membrane switch assembly. The present invention is directed to the achievement of an improved membrane switch assembly having an integral tail and a tail insulator which can be manufactured without the necessity of a separate manufacturing step to provide insulation on the surface of the tail.

A membrane switch assembly in accordance with the invention has three parallel layers, the three layers comprising first and second parallel insulating supports having opposed first and second surfaces and a spacer between the first and second surfaces. At least one of the supports is a flexible layer. Opposed switch electrodes are provided at switch sites on the first and second surfaces and openings are provided in the spacer at the switch sites. Circuit conductors are provided on the one support which is a flexible layer and extend between and among the switch electrodes on the one support. An integral tail extends from the one support, the tail having a free end and having an end portion which is adjacent to the free end. The circuit conductors have lead portions which extend onto one surface of the tail and substantially to the free end of the tail. A tail insulator is provided in covering and insulating relationship to the lead portions, the tail insulator extending to the end portion of the tail so that contact portions of the lead conductors, on the end portion of the tail, are exposed. The membrane switch assembly is characterized in that the assembly comprises a second flexible layer, the second flexible layer being one of the layers other than the flexible layer which has the integral tail. The second flexible layer has an integral tail insulator extending therefrom, the tail insulator being substantially co-extensive with the tail and being in covering relationship to the one surface of the tail. The tail insulator has a free end and an opening is provided in the tail insulator adjacent to the free end. The free end of the tail is threaded through the opening and the end portion of the tail extends beyond the opening and beside the other surface of the tail whereby the contact portions only of the lead portions of the conductors are exposed. The second flexible layer may be the spacer or the other support.

In accordance with further embodiments, the tail and the tail insulator have opposed edges at the opening in the tail insulator. The opposed edges prevent movement of the tail insulator along the tail towards the second flexible layer whereby the tail and the tail insulator are maintained in side-by-side relationship with the tail insulator in covering relationship to the lead portion of the conductors. The opening in the tail insulator may be a slot that extends normally of the side edges of the tail insulator.

In accordance with a further embodiment, the tail is of reduced width and has a shoulder directed towards the free end of the tail and the slot in the tail insulator has a width which is substantially equal to the width of the end portion of the tail. The opposed edges are then the shoulder and edges of the slot. An alternative embodiment is characterized in that the end portion of the tail has a constricted width portion which is spaced from the free end of the tail, the constricted width portion being positioned in the slot in the tail insulator and the opposed edges being on the constricted width portion and the slot.

An alternative embodiment of the invention comprises a substrate, a membrane extending parallel to the substrate, a spacer between the membrane and the substrate, and a covering layer in covering relationship to the membrane. The substrate is flexible and has an integral tail extending therefrom. Switch electrodes are provided on the opposed surfaces of the substrate and the membrane, and circuit conductors are provided on the substrate. The circuit conductors extend between and among the switch electrodes on the substrate and have lead portions which extend onto one surface of the tail and to the free end thereof. The lead portions have contact portions on an end portion of the tail which extends from a location adjacent to the free end of the tail to the free end thereof. A tail insulator is provided on the tail extending only to the end portion so that the contact portions are exposed. The membrane switch assembly is characterized in that the tail comprises an integral extension of the covering layer and is substantially co-extensive with the tail. The tail insulator has a free end which is adjacent to the free end of the tail. An opening is provided in the tail insulator adjacent to the free end of the tail insulator and the free end of the tail is threaded through the opening. The end portion of the tail extends beyond the opening and beside the other surface of the tail whereby the contact portions only of the lead portions of the conductors are exposed.

DESCRIPTION OF THE DRAWINGS

FIG. 1 is a perspective view of a membrane switch assembly in accordance with the invention.

FIG. 2 is a view of the assembly of FIG. 1 with the membrane in its unfolded position and with the separator exploded from the substrate.

FIG. 3 is an enlarged plan view of the end portion of the tail and the tail insulator of the embodiment of FIG. 1.

FIG. 4 is a view similar to FIG. 3 showing an alternative embodiment.

FIG. 5 is a view similar to FIG. 2 showing an alternative embodiment in which the tail insulator is integral with the membrane.

FIG. 6 is a perspective view, similar to FIG. 1, of a further embodiment in which the tail insulator is provided on a covering layer or panel of the assembly.

BRIEF DESCRIPTION OF THE PREFERRED EMBODIMENTS

FIGS. 1-3 show a membrane switch assembly 2 which comprises a substrate layer 4, a separator layer 6, and a membrane layer 8. Membrane layer 8 and the substrate layer 4 are formed from a single sheet of insulating film, such as polyester film, and are connected by integral hinges 10 which permit folding of the membrane layer 8 towards the substrate layer 4 until the surfaces of these two layers are opposed to each other. The opposed surfaces have switch electrodes 12 and 14 on the layers 4 and 6 respectively and conductors 16, 18 extend between and among the switch electrodes. The separator 6 is a flexible film and has openings 20 at the switch sites so that upon application of finger pressure to the external surface of the membrane at a switch site, the associated electrodes 14 will be placed in contact with the associated electrode 12 on the substrate.

It will be understood that the assembly 2 shown in FIG. 1 will usually be mounted on a surface with a bezel in surrounding relationship to its edges or it may be mounted in a molded frame or the like. In any event, the substrate 4 is provided with an integral extension or tail 22 and lead portions of the conductors 16 extend onto this tail as shown at 24. The lead portions extend to the free end 26 of the tail. The end portion 28 of the tail is a slightly reduced width and has shoulders 30 which are directed towards the free end 26.

The separator 6 has an integral tail insulator 32 having a slightly enlarged end portion 34 in which there is provided an opening in the form of a slot 36. The width of the slot is substantially equal to the width of the end portion of the tail 22 and the length of the tail insulator 32 is slightly less than the length of the tail 22.

When the parts shown in FIG. 2 are assembled, the separator 6 is positioned against the surface of the substrate 4 and the free end 26 of the tail is inserted through the slot 36 until the shoulders 30 engage edge portions of the slot as shown in FIG. 3. The membrane 8 is then folded towards the substrate and the parts are bonded or otherwise secured in their assembled condition. In the finished assembly, FIG. 1, the tail insulator 32 will extend in covering relationship to the lead portions 24 of the conductors but the end portions of the conductor, which lie between the shoulders 30 and the free end 26 of the tail will be exposed on the underside of the assembly as viewed in FIG. 2. The end portion of the tail can then be inserted into a connector to establish contact between the circuit conductors and the external conductors.

FIG. 4 shows an embodiment which is similar to the embodiment of FIGS. 1 and 2 excepting that the tail 22 has a constricted portion 38 adjacent to its free end 26. The width of the tail at the constricted portion is substantially equal to the width of the slot 36 and the tail in this embodiment must be folded in order to permit insertion through the slot 36.

FIG. 5 shows a further embodiment which is generally similar to the embodiment of FIG. 1 excepting that the tail insulator 40 is integral with the membrane 8 rather than the separator 6. In other respects, the embodiments of FIGS. 1 and 5 are substantially similar and the tail insulator 40 of FIG. 5 performs the same functions as the insulator of the embodiment of FIG. 1. It should be mentioned where the tail insulator 40 is integral with the membrane, it is not necessary to use a film type spacer 8 as shown in FIG. 5; rather than a film, a layer of insulating material can be applied to one or both of the surfaces of the membrane and the substrate to maintain separation between these opposed surfaces.

FIG. 6 shows a further embodiment in which an additional layer 42 is provided in covering relationship to the surface of the membrane. The additional layer may have graphics thereon as indicated at 44 and has an integral tail insulator 46 which extends in covering relationship to the tail which in this instance, extends from the substrate.

Some membrane switch assemblies of the general type shown in FIG. 6 may have a separator between the upper most layer 42 and the surface of the membrane 8. The tail insulator can be integral with this additional separator if desired.

It will be apparent from the foregoing description that the practice of the invention eliminates the need for the use of a separator insulating layer on the tail and that the insulating covering from the tail can be obtained from other parts of the membrane switch assembly.

I claim:

1. A membrane switch assembly of the type having three parallel layers, the three layers comprising first and second parallel insulating supports having opposed first and second surfaces and a spacer between the first and second surfaces, at least one of the supports being a flexible layer, opposed switch electrodes at switch sites on the first and second surfaces and openings in the spacer at the switch sites, circuit conductors on the one support which is a flexible layer extending between and among the switch electrodes of the one support, an integral tail extending from the one support, the tail having a free end and having an end portion which is adjacent to the free end, the circuit conductors having lead portions which extend onto one surface of the tail and substantially to the free end of the tail, and a tail insulator in covering and insulating relationship to the lead portions, the tail insulator extending to the end portion of the tail so that contact portions of the lead conductors on the end portion of the tail are exposed, the membrane switch assembly being characterized in that:

the assembly comprises a second flexible layer, the second flexible layer being one of the layers other than the flexible membrane which has the integral tail, the second flexible layer has an integral tail insulator extending therefrom, the tail insulator being substantially co-extensive with the tail and being in covering relationship to the one surface of the tail, the tail insulator having a free end, a slot is provided in the tail insulator adjacent to the free end of the tail insulator, the slot extending normally of the side edges of the tail insulator, the free end of the tail being threaded through the slot, the end portion of the tail extending beyond the slot and beside the tail insulator whereby the contact portions only of the lead portions of the conductors are exposed, the tail and the tail insulator having opposed edges at the slot in the tail insulator, the opposed edges preventing movement of the tail insulator along the tail towards the second flexible layer whereby the tail and the tail insulator are maintained in side-by-side relationship with the tail insulator in covering relationship to the lead portions of the conductors.

2. A membrane switch assembly as set forth in claim 1 characterized in that the second flexible layer is the spacer.

3. A membrane switch assembly as set forth in claim 1 characterized in that the second flexible layer is the other support.

4. A membrane switch assembly as set forth in claim 1 characterized in that the end portion of the tail is of reduced width and has a shoulder directed towards the free end of the tail, the slot in the tail insulator having a width which is substantially equal to the width of the end portion of the tail, the opposed edges being the shoulder and edges of the slot.

5. A membrane switch assembly as set forth in claim 1 characterized in that the end portion of the tail has a constricted width portion which is spaced from the free end of the tail, the constricted width portion being in the slot in the tail insulator, the opposed edges being in the constricted width portion and the slot.

6. A membrane switch assembly as set forth in claim 5 characterized in that the second flexible layer is the spacer.

7. A membrane switch assembly as set forth in claim 5 characterized in that the second flexible layer is the other support.

8. A membrane switch assembly as set forth in claim 4 characterized in that the second flexible layer is the spacer.

9. A membrane switch assembly as set forth in claim 4 characterized in that the second flexible layer is the other support.

10. A membrane switch assembly of the type comprising a substrate, a membrane extending parallel to the substrate, a spacer between the membrane and the substrate, and a covering layer in covering relationship to the membrane, the substrate being flexible and having an integral tail extending therefrom, switch electrodes on the opposed surfaces of the substrate and the membrane, and circuit conductors on the substrate, the circuit conductors extending between and among the switch electrodes on the substrate, the circuit conductors having lead portions which extend onto one surface of the tail and to the free end thereof, the lead portions having contact portions on an end portion of the tail which extends from a location adjacent to the free end of the tail to the free end thereof, and a tail insulator on the tail extending to the end portion so that the contact portions are exposed, the membrane switch assembly being characterized in that:

the tail insulator comprises an integral extension of the covering layer, the tail insulator being substantially co-extensive with the tail, the tail insulator having a free end which is adjacent to the free end of the tail, a slot is provided in the tail insulator adjacent to the free end of the tail insulator, the slot extending normally of the side edges of the tail insulator, the free end of the tail being threaded through the slot, the end portion of the tail extending beyond the slot and beside the tail insulator whereby the contact portions only of the lead portions of the conductors are exposed, the tail and the tail insulator having opposed edges at the slot in the tail insulator, the opposed edges preventing movement of the tail insulator along the tail towards the covering panel whereby the tail and the tail insulator are maintained in side-by-side relatinship with the tail insulator in covering relationship to the lead portions of the conductors.

11. A membrane switch assembly as set forth in claim 10 characterized in that the end portion of the tail is of reduced width and has a shoulder directed towards the free end of the tail, the slot in the tail insulator having a width which is substantially equal to the width of the end portion of the tail, the opposed edges being the shoulder and edges of the slot.

12. A membrane switch assembly as set forth in claim 10 characterized in that the end portion of the tail has a constricted width portion which is spaced from the free end of the tail, the constricted width portion being in the slot in the tail insulator, the opposed edges being in the constricted width portion and the slot.

* * * * *